(12) United States Patent
Yati

(10) Patent No.: US 10,970,834 B2
(45) Date of Patent: Apr. 6, 2021

(54) DEFECT DISCOVERY USING ELECTRON BEAM INSPECTION AND DEEP LEARNING WITH REAL-TIME INTELLIGENCE TO REDUCE NUISANCE

(71) Applicant: KLA-TENCOR CORPORATION, Milpitas, CA (US)

(72) Inventor: Arpit Yati, Lucknow (IN)

(73) Assignee: KLA-Tencor Corporation, Milpitas, CA (US)

( * ) Notice: Subject to any disclaimer, the term of this patent is extended or adjusted under 35 U.S.C. 154(b) by 272 days.

(21) Appl. No.: 16/034,483

(22) Filed: Jul. 13, 2018

(65) Prior Publication Data

US 2019/0213733 A1  Jul. 11, 2019

Related U.S. Application Data

(60) Provisional application No. 62/636,032, filed on Feb. 27, 2018.

(30) Foreign Application Priority Data

Jan. 5, 2018 (IN) .............................. 201841000585

(51) Int. Cl.
| | |
|---|---|
| *G06K 9/00* | (2006.01) |
| *G06T 7/00* | (2017.01) |
| *G06K 9/62* | (2006.01) |
| *H01L 21/66* | (2006.01) |
| *H01L 21/67* | (2006.01) |
| *G06N 20/00* | (2019.01) |
| *H01J 37/244* | (2006.01) |
| *H01J 37/28* | (2006.01) |

(52) U.S. Cl.
CPC .......... *G06T 7/0006* (2013.01); *G06K 9/6267* (2013.01); *G06N 20/00* (2019.01); *G06T 7/001* (2013.01); *H01L 21/67288* (2013.01); *H01L 22/12* (2013.01); *H01L 22/20* (2013.01); *G06T 2207/20081* (2013.01); *G06T 2207/30148* (2013.01); *H01J 37/244* (2013.01); *H01J 37/28* (2013.01)

(58) Field of Classification Search
CPC ....... G06T 7/0006; G06T 7/001; G06N 20/00; G06K 9/6267; H01L 21/67288; H01L 22/12; H01L 22/20
USPC ........................................................ 382/149
See application file for complete search history.

(56) References Cited

U.S. PATENT DOCUMENTS

| | | | | |
|---|---|---|---|---|
| 9,286,675 | B1 * | 3/2016 | Shabtay | ................ G06T 7/0012 |
| 2006/0105475 | A1 * | 5/2006 | Ciplickas | ................ H01L 22/20 |
| | | | | 438/14 |

(Continued)

FOREIGN PATENT DOCUMENTS

JP            5439543 B2    3/2014

OTHER PUBLICATIONS

ISA/KR, International Search Report and Written Opinion for PCT/US2019/012236 dated Apr. 26, 2019.

*Primary Examiner* — Stephen P Coleman
(74) *Attorney, Agent, or Firm* — Hodgson Russ LLP

(57) ABSTRACT

A deep learning algorithm is used for defect discovery, such as for semiconductor wafers. A care area is inspected with the wafer inspection tool. The deep learning algorithm is used to identify and classify defects in the care area. This can be repeated for remaining care areas, but similar care areas may be skipped to increase throughput.

14 Claims, 4 Drawing Sheets

(56) References Cited

U.S. PATENT DOCUMENTS

| | | |
|---|---|---|
| 2012/0245861 A1 | 9/2012 | Greene |
| 2015/0022654 A1 | 1/2015 | Greenberg et al. |
| 2015/0042978 A1 | 2/2015 | Lynch |
| 2016/0377561 A1 | 12/2016 | Ramachandran et al. |
| 2017/0194126 A1* | 7/2017 | Bhaskar .................. H01J 37/28 |
| 2017/0200264 A1* | 7/2017 | Park ........................ G06T 7/001 |
| 2017/0337673 A1* | 11/2017 | Tseng ...................... G06T 7/001 |
| 2019/0187555 A1* | 6/2019 | Lin ..................... G03F 7/70491 |

\* cited by examiner

DEFECT DISCOVERY USING ELECTRON BEAM INSPECTION AND DEEP LEARNING WITH REAL-TIME INTELLIGENCE TO REDUCE NUISANCE

CROSS-REFERENCE TO RELATED APPLICATIONS

This application claims priority to Indian Provisional Application No. 201841000585, filed on Jan. 5, 2018, and U.S. Application No. 62/636,032, filed Feb. 27, 2018, the disclosures of which are hereby incorporated by reference.

FIELD OF THE DISCLOSURE

The disclosure generally relates to semiconductor inspection. More particularly the disclosure generally relates to methods for efficiently discovering defects based on prediction.

BACKGROUND OF THE DISCLOSURE

Evolution of the semiconductor manufacturing industry is placing ever greater demands on yield management and, in particular, on metrology and inspection systems. Critical dimensions continue to shrink. Economics is driving the industry to decrease the time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Defect discovery, or the discovery of critical defect types, is part of manufacturing semiconductor devices. Finding all critical defect types in the least possible time can improve yield during semiconductor manufacturing, and electron beam inspection is being relied on more frequently for such defect discovery. The faster that defect types are identified in a layer, the sooner that these defects can be fixed. Finding all critical defect types is often referred to as defect discovery. A defect discovery process typically involves an inspection review cycle in which a layer is first inspected using a hot scan, potential defect sites are sampled using various algorithms (e.g., diversity sampling), and then a scanning electron microscope (SEM) image is reviewed to confirm the defect sites. The flow might be repeated in case all defect types are not found by further tuning the inspection recipe.

FIG. 1 is a flowchart of a previous technique. This conventional method of defect discovery involves using a broadband plasma (BBP) inspection tool to perform a hot scan with various optical modes. Sites are diversity sampled based on BBP attributes to ensure a diverse sample set is obtained. The diverse sample set is then reviewed using an SEM to confirm various defect types.

This previous technique has disadvantages. First, it may take one to two days to find all the defect types using the previous technique. Multiple iterations may be needed to tune the BBP recipe that catches all defects. There is an extremely high nuisance rate in the BBP inspection scan, which can lead to difficulty when performing deskew when a design is not available. BBP has gaps for many defect types such as copper chemical mechanical planarization (CuCMP) bridge or voltage contrast (VC) defects. Optical inspection gap defects also cannot be discovered. There is no real-time intelligence to vary inspection or sampling based on already-identified defect types. The wafer needs to be moved on two different tools and their coordinate systems need to be matched. Inspection scans have a low defect count, leading to higher de-skew time on the SEM tool, which can be upwards of two hours. In the case of missing defect types, the whole inspection flow must be repeated including returning to the BBP recipe, SEM review, and classification.

Therefore, improved defect discovery is needed.

BRIEF SUMMARY OF THE DISCLOSURE

A method for adaptive defect discovery is provided in a first embodiment. A plurality of care areas are received at a wafer inspection tool. A first of the care areas is inspected with the wafer inspection tool. Using a deep learning algorithm with a processor, defects are identified in the first of the care areas. Using the deep learning algorithm with the processor, the defects in the first of the care areas are classified. The inspecting, the identifying, and the classifying are repeated for any remaining of the plurality of care areas.

The care areas may be received from design software.

The inspecting can include imaging using the wafer inspection tool.

The method can further include skipping inspection of additional instances of the first of the care areas after defects are classified in a first instance of the first of the care areas. Each instance of the first of the care areas includes a like device, structure, or dimension.

The care area can have an area of 100 $\mu m^2$ or less. For instance, the care area may be 50 $\mu m^2$.

The method can further include identifying probable types of defects in the care areas using the deep learning algorithm with the processor.

The inspecting, the identifying, and the classifying can occur while a wafer having the care areas is in the same wafer inspection tool.

The method can further include holding a wafer with the care areas on a chuck in the wafer inspection tool during the inspecting, the identifying, and the classifying.

An adaptive defect discovery system is provided in a second embodiment. The adaptive defect discovery system includes an electron beam source that generates electrons focused on a wafer; an electron column; a detector; and a processor in electronic communication with the detector and the electron beam source. Electrons returned from the wafer are focused on the detector, and wherein the detector is used to capture an image of the wafer. The processor is configured to: receive a plurality of care areas; send instructions to inspect a first of the care areas to the electron beam source and the detector; identify defects in an image of the first of the care areas using a deep learning algorithm; classify the defects in the first of the care areas using the deep learning algorithm; and repeat the sending, the identifying, and the classifying for any remaining of the plurality of care areas.

The care areas may be received from design software.

The processor may be further configured to identify probable types of defects in the care areas using the deep learning algorithm.

The processor may be further configured to skip inspection of additional instances of the first of the care areas after defects are classified in a first instance of the first of the care areas. Each instance of the first of the care areas includes a like device, structure, or dimension.

The care area can have an area of 100 $\mu m^2$ or less. For instance, the care area may be 50 $\mu m^2$.

The care areas may be of a wafer. The wafer may be held in the adaptive defect discovery system when the processor identifies the defects and classifies the defects.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Defect discovery an important production step for semiconductor foundries. It reduces time-to-product and can help with ramp-up. The present disclosure provides for defect discovery using an inspection or review system, such as electron beam inspection, and deep learning with real time intelligence to reduce nuisance. Defect discovery with electron beam inspection tools can be improved with deep learning to speed up the process. Embodiments of the present disclosure increase the efficiency of defect discovery by using real-time intelligence to find new defect types. This can enable the use of a single tool to perform inspection, review, and classification in real-time to save time and cost for foundries in production, as well as reduce the cost of maintaining multiple tools. Using inspection and review in the same flow to identify new and unique defects with deep learning can increase the speed at which identification occurs.

In an instance, a wafer inspection tool, such as an electron beam inspection tool, gets inspection care areas from design-related software, a semiconductor manufacturer, and/ or an application having diverse set of locations covering all possible defect type locations. The wafer inspection tool then inspects those locations and detects real defects. After the main field inspection is over, the wafer inspection tool obtains high resolution images which can be used by deep learning algorithms to train and classify defects. The deep learning algorithm also can identify different types of defects for an operator to classify. Once a new defect type is identified in a care area, the wafer inspection tool can move on to different and/or diverse types of care areas where the probability of finding a new defect type is high. Thus, care areas that are like the care area where a defect type is already found are skipped to expedite review.

Figure 1:
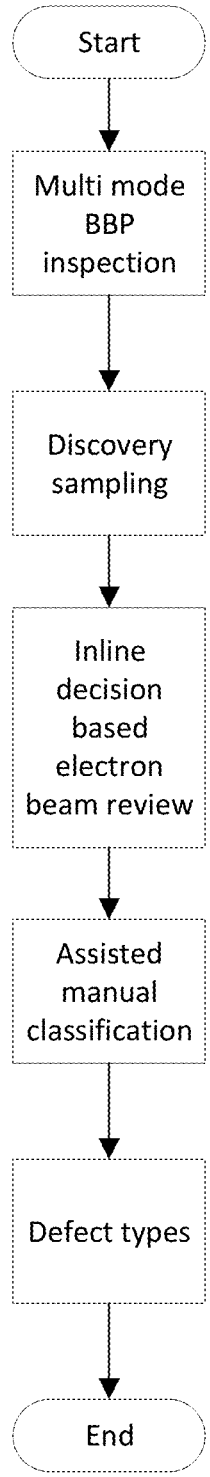
FIG. 1 is a flowchart of a previous technique.
Figure 2:
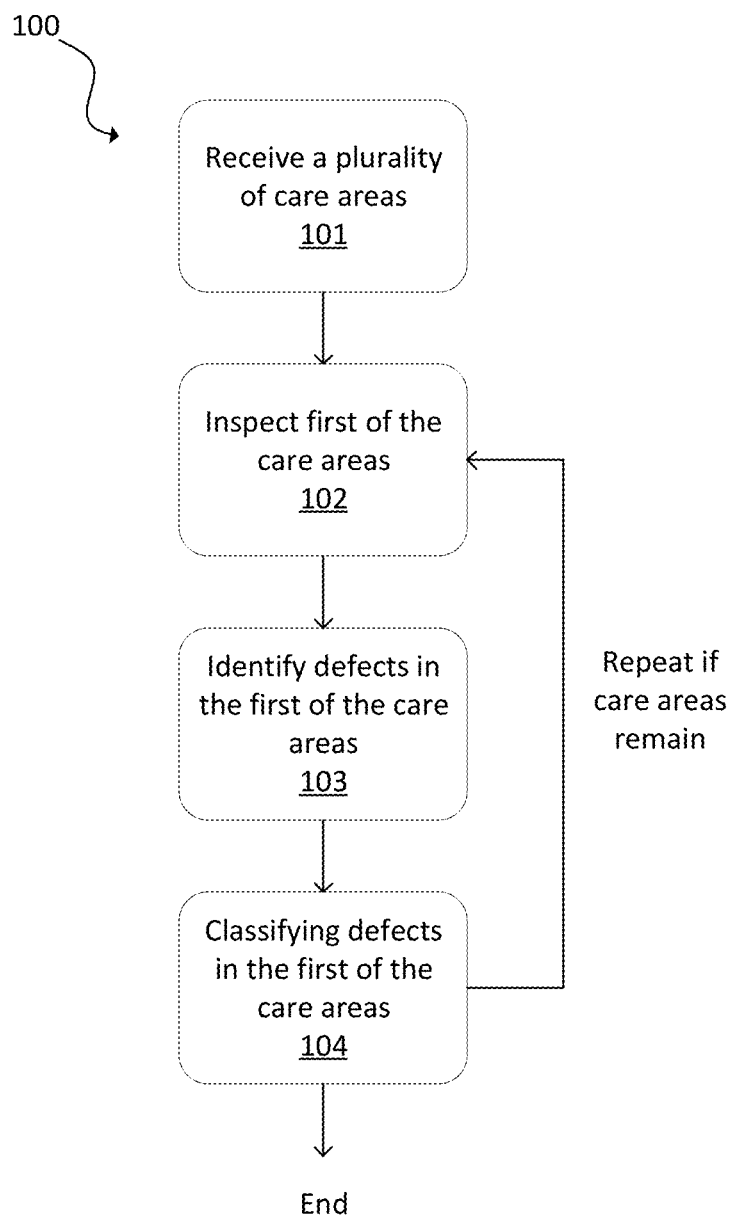
FIG. 2 is a flowchart of an embodiment of a method in accordance with the present disclosure.

FIG. 2 is a flowchart of a method 100 for adaptive defect discovery. At 101, a plurality of care areas are received at a wafer inspection tool. The wafer inspection tool may be an electron beam inspection tool such as an SEM. Each care area may have an area of 100 $\mu m^2$ or less, such as an area of 50 $\mu m^2$. The care areas may be received from design software, an operator, and/or an application.

At 102, a first of the care areas is inspected with the wafer inspection tool. The inspection at 102 can include imaging the wafer with the wafer inspection tool. Any defects in the first of the care areas are identified using a processor at 103. The defects in the first of the care areas are classified using the processor at 104. Both 103 and 104 may use a deep learning algorithm on the images from the inspection at 102.

Any type of machine learning-based algorithm can be used at 103 and 104. In an instance, the deep learning algorithm can be pre-trained on existing SEM images of defects. In another instance, a random forest algorithm is used to filter new types of defects, and an operator can then classify these defects.

Steps 102, 103, and 104 may be repeated for any remaining care areas of the plurality of care areas. If no care areas remain, then the method 100 may end. To increase efficiency, inspection of additional instances of the first of the care areas are skipped if defects are classified in the first instance of the care areas. Each instance of the first of the care areas can include a like device, structure, or dimension. A like device, structure, or dimension may be similar or the same. In an example, a like device, structure, or dimension may be within a particular dimension threshold such as a width threshold. In another example, a like device, structure, or dimension may be within a particular tolerance threshold with respect to shape.

With respect to skipping certain care areas, care areas can be grouped together based on similarities. Design-based grouping (DBG) codes can be used to group such care areas together. Once a defect is found in one care area, other care areas of similar properties can be skipped for the first round of defect discovery. Those sites can be revisited if all types of defects are not found.

Probable types of defects in the care areas can be identified based on the deep learning algorithm using the processor. In an instance, real time intelligence can identify new locations for finding all defect types, which can provide faster time to results. Sites that probably contain one of the already discovered defect types may be ignored.

The inspection, SEM review, and classification using deep learning can be performed during runtime in a single session.

The steps 102, 103, and 104 can occur while a wafer that includes the care areas is in the same wafer inspection tool. Thus, the wafer with the care areas can be held on a chuck in the wafer inspection tool during steps 102, 103, and 104.

While deep learning is specifically disclosed, a random forest technique also can be used.

In another embodiment of the present invention, the inspection care areas are a diverse set of locations covering all possible defect type locations.

Figure 3:
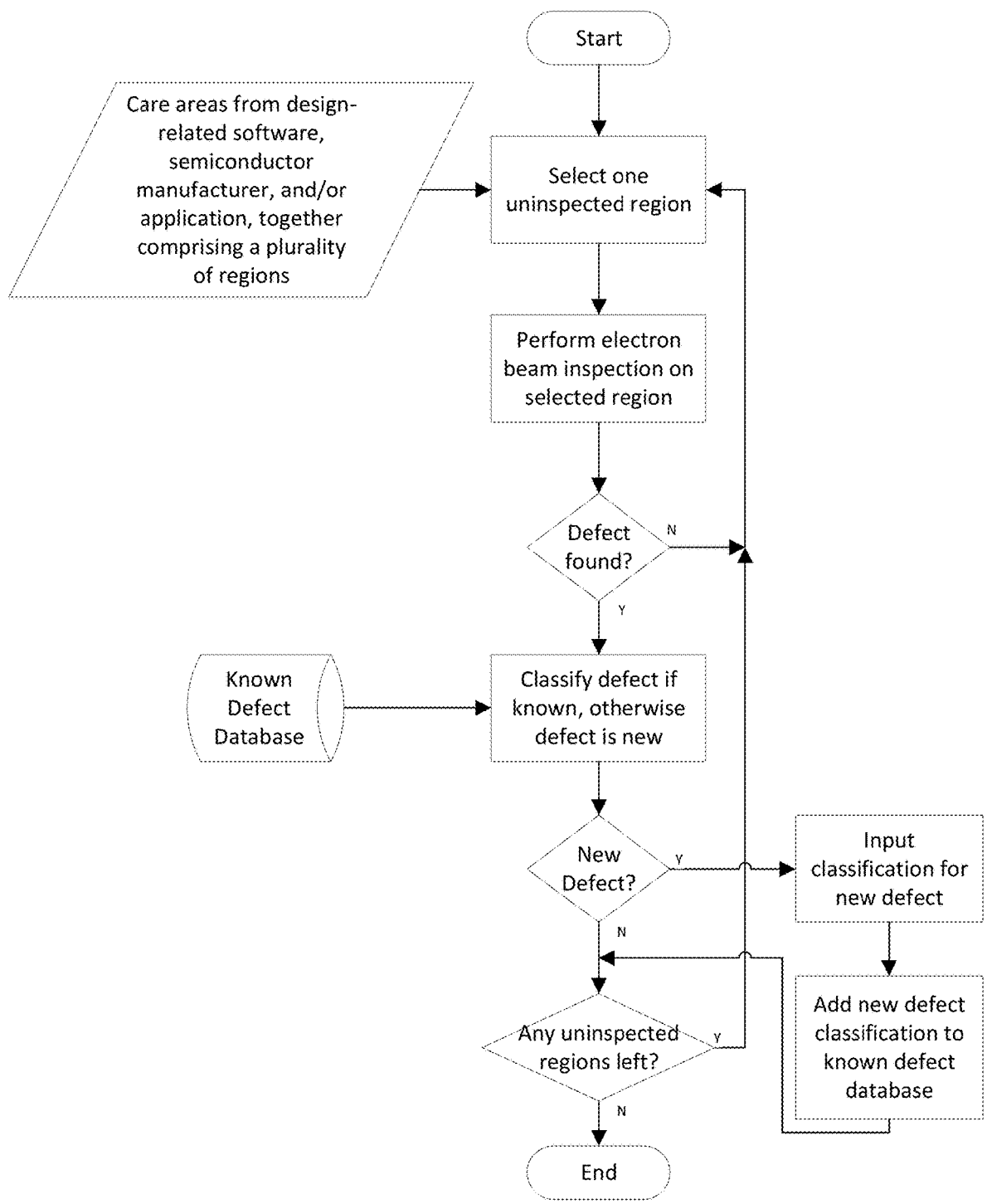
FIG. 3 is a flowchart of another embodiment of a method in accordance with the present disclosure.

With reference to FIG. 3, another embodiment of the present invention comprises a method for adaptive defect discovery. The embodiment of FIG. 3 can be used with the embodiment of FIG. 2 or may be used separately. Inspection care areas are received, wherein the inspection care areas are aggregated to a plurality of regions to inspect. Each region can be inspected in turn, to determine the defects present in the plurality of the regions.

This inspection includes operations as follows. A region that has not yet been inspected is selected and inspected, such as with an SEM. If a defect is found in the selected region, it is classified. This classification can include referencing a set of known defect types and determining whether the defect found is classifiable as one of the known defect types. If it is, it is classified as such. If the defect found is not classifiable as one of the known defect types, it is considered a new defect. The known defect types may be stored in a database. The operator can be asked to input a classification for a new defect, and the classification given by the operator can be used to classify the found defect and added to the set of known defect types. These operations may be repeated until each of the regions in the plurality of regions have been inspected. Some regions that are similar to existing regions where a defect was identified may be skipped. The defect in similar regions may include a like device, structure, or dimension.

An advantage of the present disclosure is that a wafer inspection tool is improved with the capability of making improved decisions to speed up the process of finding new defect types. This avoids performing further inspection in the same area where a defect is already found because there is a low probability of finding a new defect in the region. Thus, time is saved by not looking for redundant defects of the same type. Furthermore, the inspection process can cease when all new and known defect types are found.

The present disclosure provides the additional advantages. Adaptive smart inspection and review based on real-time inspection data can yield a low nuisance rate by using real-time intelligence to move to different areas for inspection after a defect type is found. Optical inspection gap defects can be covered.

Results can potentially be provided 2× to 3× faster results by performing inspection and review on the same tool. This also can provide real-time nuisance reduction and can reduce or eliminate deskew requirements. Using conventional methods, nuisance is generated because the whole wafer is inspected. The nuisance rate is kept high to avoid missing any defect type. With the proposed method inspection of large areas can be skipped because of intelligent guidance from defects already found and selecting care area groups which are not inspected before. Performing the steps on the same tool also can reduce time-to-review and can eliminate the need to move the wafer between tools for inspection.

There may be no need to perform a second round of the wafer inspection and review process to locate a missing defect type if that defect type is missing. Thus, there is may be no need to redo the entire process. Embodiments disclosed herein can use a continuous defect inspection and review job, intelligently guided by the defects already discovered. This process can run continuously until all defect types expected by a semiconductor manufacturer are not found.

The effort of visiting nuisance sites by inspection and review tools can be reduced because when a new type is found, similar sites or care areas do not need to be visited and inspection can move to a different type of site or care area immediately.

Inspection and review can stop as soon as all the defect types are found. This has multiple benefits.

Defects can be detected and classified in real time. Greater defect sensitivity can be provided using the embodiments disclosed herein. First, an adaptive smart inspection and review based on real-time inspection data has a low nuisance rate because real-time intelligence to moves to different areas for inspection once a defect type is found. Second, this can cover optical inspection gap defects. Third, this can provide 2× to 3× faster time to results. The faster time to result occurs because the inspection review occurs on the same tool with real time nuisance reduction and no deskew requirements. Fourth, in case of missing defect types, the electron beam inspection scan can continue from where it stopped. There is no need to redo the whole process. Fifth, this reduces the effort of visiting nuisance sites by inspection and review tools. As soon as a new type is found, similar sites and/or care areas do not need to be visited. Inspection can move to a different type of care areas and/or sites immediately. Sixth, existing process flows require BBP inspection and SEM review on separate tools thus increasing time to result. The logistical cost of moving the wafer on multiple tools, deskew time, etc. is reduced using this method. Deskew can potentially be eliminated because the same tool may do the inspection and the review. Seventh, real time defect detection and classification is performed. Eighth, better defect sensitivity is achieved because of better SEM resolution may be provided. Electron beam inspection will have capability to close gaps currently present with BBP tools. Ninth, this technique can provide baseline to BBP tools for their recipe setup and high-volume manufacturing (HVM) monitoring.

While disclosed for semiconductor wafer inspection, embodiments of the techniques disclosed herein also can be used for photomask inspection or other forms of inspection.

Figure 4:
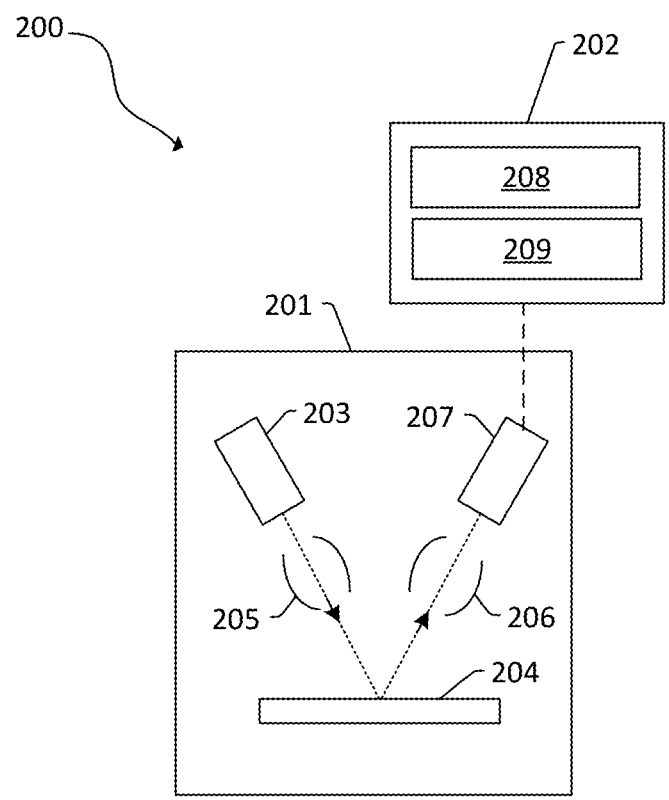
FIG. 4 is a block diagram of a system in accordance with the present disclosure.

FIG. 4 is a block diagram of an embodiment of a system 200. The system 200 includes a wafer inspection tool (which includes the electron column 201) configured to generate images of a wafer 204.

The wafer inspection tool includes an output acquisition subsystem that includes at least an energy source and a detector. The output acquisition subsystem may be an electron beam-based output acquisition subsystem. For example, in one embodiment, the energy directed to the wafer 204 includes electrons, and the energy detected from the wafer 204 includes electrons. In this manner, the energy source may be an electron beam source. In one such embodiment shown in FIG. 4, the output acquisition subsystem includes electron column 201, which is coupled to computer subsystem 202. A chuck (not illustrated) may hold the wafer 204.

As also shown in FIG. 4, the electron column 201 includes an electron beam source 203 configured to generate electrons that are focused to wafer 204 by one or more elements 205. The electron beam source 203 may include, for example, a cathode source or emitter tip. The one or more elements 205 may include, for example, a gun lens, an anode, a beam limiting aperture, a gate valve, a beam current selection aperture, an objective lens, and a scanning subsystem, all of which may include any such suitable elements known in the art.

Electrons returned from the wafer 204 (e.g., secondary electrons) may be focused by one or more elements 206 to detector 207. One or more elements 206 may include, for example, a scanning subsystem, which may be the same scanning subsystem included in element(s) 205.

The electron column also may include any other suitable elements known in the art.

Although the electron column 201 is shown in FIG. 4 as being configured such that the electrons are directed to the wafer 204 at an oblique angle of incidence and are scattered from the wafer 204 at another oblique angle, the electron beam may be directed to and scattered from the wafer 204 at any suitable angles. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

Computer subsystem 202 may be coupled to detector 207 as described above. The detector 207 may detect electrons returned from the surface of the wafer 204 thereby forming electron beam images of the wafer 204. The electron beam images may include any suitable electron beam images. Computer subsystem 202 may be configured to perform any of the functions described herein using the output of the detector 207 and/or the electron beam images. Computer subsystem 202 may be configured to perform any additional step(s) described herein. A system 200 that includes the output acquisition subsystem shown in FIG. 4 may be further configured as described herein.

It is noted that FIG. 4 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 4 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 202 includes a processor 208 and an electronic data storage unit 209. The processor 208 may include a microprocessor, a microcontroller, or other devices. The processor 208 and/or the electronic data storage unit 209 optionally may be in electronic communication with a wafer inspection tool or a wafer review tool (not illustrated) to receive additional information.

The computer subsystem 202 may be coupled to the components of the system 200 in any suitable manner (e.g., via one or more transmission media, which may include wired and/or wireless transmission media) such that the processor 208 can receive output. The processor 208 may be configured to perform a number of functions using the output. The wafer inspection tool can receive instructions or other information from the processor 208. The processor 208 and/or the electronic data storage unit 209 optionally may be in electronic communication with another wafer inspection tool, a wafer metrology tool, or a wafer review tool (not illustrated) to receive additional information or send instructions.

The processor 208 is in electronic communication with the wafer inspection tool, such as the detector 207. The processor 208 may be configured to process images generated using measurements from the detector 207. For example, the processor may perform embodiments of the method 100 or FIG. 3.

The computer subsystem 202, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 208 and electronic data storage unit 209 may be disposed in or otherwise part of the system 200 or another device. In an example, the processor 208 and electronic data storage unit 209 may be part of a standalone control unit or in a centralized quality control unit. Multiple processors 208 or electronic data storage unit 209 may be used.

The processor 208 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 208 to implement various methods and functions may be stored in readable storage media, such as a memory in the electronic data storage unit 209 or other memory.

If the system 200 includes more than one computer subsystem 202, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured to perform a number of functions using the output of the system 200 or other output. For instance, the processor 208 may be configured to send the output to an electronic data storage unit 209 or another storage medium. The processor 208 may be further configured as described herein.

The processor 208 or computer subsystem 202 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured according to any of the embodiments described herein. The processor 208 also may be configured to perform other functions or additional steps using the output of the system 200 or using images or data from other sources.

The processor 208 may be communicatively coupled to any of the various components or sub-systems of system 200 in any manner known in the art. Moreover, the processor 208 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 208 and other subsystems of the system 200 or systems external to system 200.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 208 (or computer subsystem 202) or, alternatively, multiple processors 208 (or multiple computer subsystems 202). Moreover, different sub-systems of the system 200 may include one or more computing or logic systems. Therefore, the above description should not be interpreted as a limitation on the present disclosure but merely an illustration.

An additional embodiment relates to a non-transitory computer-readable medium storing program instructions executable on a processor. In particular, a processor, such as the processor 208, can be coupled to a memory in an electronic data storage medium with non-transitory computer-readable medium, such as the electronic data storage medium 209, that includes executable program instructions. The computer-implemented method may include any step(s) of any method(s) described herein. For example, processor 208 may be programmed to perform some or all of the steps of method 100 or the method of FIG. 3. The memory in the electronic data storage medium 209 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In an embodiment, one or more programs are included on a non-transitory computer-readable storage medium, such as the electronic data storage medium 209. The one or more programs are for executing steps on one or more computing devices, such as the processor 208. For example, the steps can include receiving a plurality of care areas, such as from design software. The steps also can include sending instructions to the electron beam source 203 and the detector 207 to inspect a first of the care areas; identifying defects in an image of the first of the care areas; classifying the defects in the first of the care areas; and repeating the sending, the identifying, and the classifying for any remaining of the plurality of care areas. The steps can include identifying probable types of defects in the care areas using a deep learning algorithm. The steps also can include skipping inspection of additional instances of the first of the care areas after defects are classified in a first instance of the first of the care areas. Each instance of the first of the care areas may include a like device, structure, or dimension. The wafer 204 can be held in the system 200 when the processor 208 identifies the defects and classifies the defects, such as on a chuck.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

Other types of wafers also may be used. For example, the wafer may be used to manufacture LEDs, solar cells, magnetic discs, flat panels, or polished plates. Defects on other objects also may be classified using techniques and systems disclosed herein.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. A method for adaptive defect discovery comprising:
   receiving a plurality of care areas at a wafer inspection tool;

inspecting a first of the care areas with the wafer inspection tool;

identifying, using a deep learning algorithm with a processor, defects in the first of the care areas;

classifying, using the deep learning algorithm with the processor, the defects in the first of the care areas;

skipping inspection of additional instances of the first of the care areas after the defects are classified in a first instance of the first of the care areas, wherein each instance of the first of the care areas includes a like device, structure, or dimension; and repeating the inspecting, the identifying, and the classifying for any remaining of the plurality of care areas.

2. The method of claim 1, wherein the care areas are received from design software.

3. The method of claim 1, wherein the inspecting includes imaging using the wafer inspection tool.

4. The method of claim 1, further comprising identifying probable types of defects in the care areas using the deep learning algorithm with the processor.

5. The method of claim 1, wherein the inspecting, the identifying, and the classifying occur while a wafer having the care areas is in the same wafer inspection tool.

6. The method of claim 1, further comprising holding a wafer with the care areas on a chuck in the wafer inspection tool during the inspecting, the identifying, and the classifying.

7. The method of claim 1, wherein the care area has an area of 100 $\mu m^2$ or less.

8. The method of claim 7, wherein the care area is 50 $\mu m^2$.

9. An adaptive defect discovery system comprising:

an electron beam source that generates electrons focused on a wafer;

an electron column;

a detector, wherein electrons returned from the wafer are focused on the detector, and wherein the detector is used to capture an image of the wafer; and a processor in electronic communication with the detector and the electron beam source, wherein the processor is configured to:

receive a plurality of care areas;

send instructions to the electron beam source and the detector to inspect a first of the care areas;

identify defects in an image of the first of the care areas using a deep learning algorithm;

classify the defects in the first of the care areas using the deep learning algorithm;

skip inspection of additional instances of the first of the care areas after the defects are classified in a first instance of the first of the care areas, wherein each instance of the first of the care areas includes a like device, structure, or dimension; and repeat the sending, the identifying, and the classifying for any remaining of the plurality of care areas.

10. The adaptive defect discovery system of claim 9, wherein the care areas are received from design software.

11. The adaptive defect discovery system of claim 9, wherein the processor is further configured to identify probable types of defects in the care areas using the deep learning algorithm.

12. The adaptive discovery system of claim 9, wherein the care areas are of a wafer, and wherein the wafer is held in the adaptive defect discovery system when the processor identifies the defects and classifies the defects.

13. The adaptive defect discovery system of claim 9, wherein the care area has an area of 100 $\mu m^2$ or less.

14. The adaptive defect discovery system of claim 13, wherein the care area is 50 $\mu m^2$.

* * * * *